US006727700B2

(12) United States Patent
Marek

(10) Patent No.: US 6,727,700 B2
(45) Date of Patent: Apr. 27, 2004

(54) SUPERCONDUCTING NMR RESONATORS GENERATING RF MAGNETIC FIELDS AT THE SAMPLE WHICH ARE SUBSTANTIALLY PARALLEL TO THE PLANE OF A RESONATOR

(75) Inventor: Daniel Marek, Moeriken (CH)

(73) Assignee: Bruker Biospin AG, Faellanden (CH)

(*) Notice: Subject to any disclaimer, the term of this patent is extended or adjusted under 35 U.S.C. 154(b) by 0 days.

(21) Appl. No.: 10/119,034

(22) Filed: Apr. 10, 2002

(65) Prior Publication Data

US 2002/0190715 A1 Dec. 19, 2002

(30) Foreign Application Priority Data

Apr. 17, 2001 (DE) .......................... 101 18 835

(51) Int. Cl.[7] ................................................ G01V 3/00
(52) U.S. Cl. ...................................... 324/318; 324/322
(58) Field of Search ................................. 324/300–322

(56) References Cited

U.S. PATENT DOCUMENTS

| 5,351,007 | A | * | 9/1994 | Withers et al. | ............. 324/322 |
| 5,565,778 | A | * | 10/1996 | Brey et al. | .................. 324/318 |
| 5,585,723 | A | | 12/1996 | Withers | |
| 5,594,342 | A | * | 1/1997 | Brey et al. | .................. 324/322 |
| 5,619,140 | A | * | 4/1997 | Brey et al. | .................. 324/318 |
| 6,121,776 | A | | 9/2000 | Marek | |
| 6,169,399 | B1 | * | 1/2001 | Zhang et al. | ............... 324/318 |
| 6,469,506 | B1 | * | 10/2002 | Felmlee et al. | ............. 324/309 |
| 6,556,013 | B2 | * | 4/2003 | Withers | ....................... 324/322 |
| 6,590,394 | B2 | * | 7/2003 | Wong et al. | ................ 324/318 |
| 2002/0190715 | A1 | * | 12/2002 | Marek | ........................ 324/318 |

FOREIGN PATENT DOCUMENTS

EP 1239297 A2 * 9/2002

* cited by examiner

Primary Examiner—G. Bradley Bennett
Assistant Examiner—Tiffany A. Fetzner
(74) Attorney, Agent, or Firm—Paul Vincent

(57) ABSTRACT

An RF receiver coil arrangement for the reception of measuring signals from a measuring sample in the measuring volume of an NMR spectrometer comprising an RF resonator having superconducting, inductively and capacitively acting conducting structures, which form resonant circuits, on planar substrate elements and which are disposed about the measuring sample, is characterized in that each individual current-carrying resonant circuit on the planar substrate element produces a magnetic field in the center of the measuring volume, which is parallel to the plane of the planar substrate element, on which the individual resonant circuit is located, wherein the deviation from parallelism, does not exceed 40 degrees. This introduces a new class of superconducting NMR resonators which better meet the technical requirements than those of prior art.

24 Claims, 14 Drawing Sheets

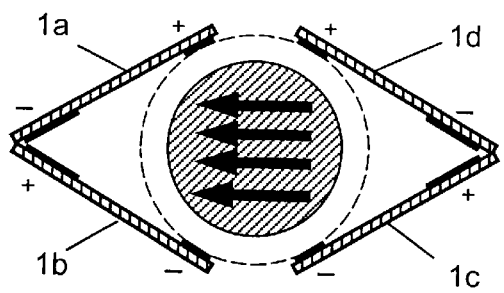
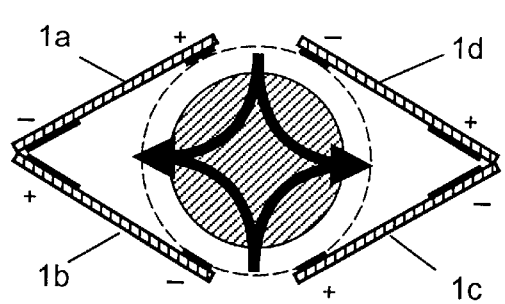
Fig.15  Fig.16
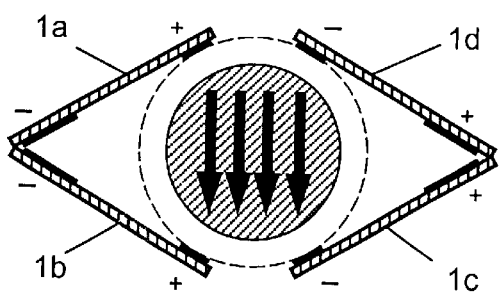
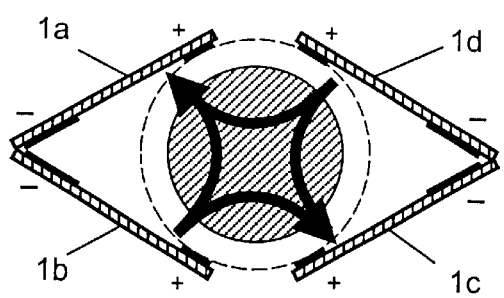
Fig.17  Fig.18

SUPERCONDUCTING NMR RESONATORS GENERATING RF MAGNETIC FIELDS AT THE SAMPLE WHICH ARE SUBSTANTIALLY PARALLEL TO THE PLANE OF A RESONATOR

This application claims Paris Convention priority of DE 101 18 835.8 filed on Apr. 17, 2001 the complete disclosure of which is hereby incorporated by reference.

BACKGROUND OF THE INVENTION

The invention concerns an RF (=radio frequency) receiver coil arrangement for receiving measuring signals from a measuring sample in the measuring volume of an NMR (=nuclear magnetic resonance) spectrometer, comprising an RF resonator having superconductive, inductively and capacitively acting conductive structures, which form resonant circuits, which are disposed on planar substrate elements, and which are disposed externally around the measuring sample.

An arrangement of this type is known from U.S. Pat. No. 5,585,723.

NMR is a very powerful and exact method for analyzing the structure of chemical compounds. Unfortunately however, it is not very sensitive. For this reason, it is of central interest in NMR to provide resonators which have as high a detection sensitivity as possible, i.e. as high a signal to noise (S/N) ratio as possible. The use of cooled and in particular superconducting radio frequency resonators permits the losses in the resonator to be kept very small thereby considerably increasing the sensitivity.

HTS material is currently the most suitable superconductor. This material has a high transition temperature and, compared to other superconductors, is very insensitive to static magnetic fields. These advantageous properties are obtained only when the superconductor is made from very thin epitaxial layers which are formed on oriented monocrystalline substrates. Since such substrates are normally only available as flat plates, the geometric shape of the resonators is constrained to be in the form of flat plates, thereby considerably limiting the possible geometric arrangements.

The substance to be measured is normally a liquid enclosed in a measuring tube usually at room temperature, which is separated from the cold NMR resonator (at approximately 20K) by an intermediate tube and a vacuum chamber.

Such arrangements are known e.g. from U.S. Pat. No. 5,585,723. Superconducting receiving resonators have the following principal problems. The static magnetization produced by the superconductor can cause field inhomogeneities which substantially prevent the generation of narrow lines in high-resolution NMR. Moreover, the finite critical current in the superconductor limits the maximum coil current for the transmitter pulse, thereby complicating or impeding short pulse widths for a predetermined NMR flip angle.

As mentioned above, the sensitivity of the resonator, i.e. its S/N ratio, plays a primary role in NMR. It depends on the volume integral of the term $B_1(x,y,z)/\sqrt{P}$, wherein $B_1$ designates the high frequency field which is produced by the resonator at the location x, y, z when provided with power P. If the contributions of the currents in the conductors all have identical values, the conventional equation $P=R \cdot I^2$ can be inserted for the power P, wherein the term in the volume integral becomes $B_1(x,y,z)/I \cdot \sqrt{R}$. This means that the larger the $B_1$ field produced by the resonator per unit current I and the smaller the overall loss resistance R of all conducting paths, the higher the sensitivity.

The NMR resonator must not only have high sensitivity but its conductors must also carry large currents to permit production of as high $B_1$ fields as possible during the transmitting phase. High $B_1$ fields permit short transmitter pulses for obtaining a given desired NMR flip angle. Such short transmitter pulses are highly desirable in NMR for various reasons which will not be discussed herein. Although resonator sensitivity allows optimum conversion of the current into a $B_1$ field, this is not sufficient in and of itself. The current should also be as high as possible. This, in turn, depends i.a. on the critical current of the superconductor and on the width of the conductor. The geometry of the resonator should therefore be such that those conductors which are mainly responsible for producing the $B_1$ field are as broad as possible and can carry the full critical current.

A further parameter which is of major importance to the NMR spectrum is the resolution. The resolution substantially depends on the relative line width which can be obtained for the NMR signal which, in turn, depends on the homogeneity of the stationary magnetic field $H_0$ in the active region of the measuring sample. Since the static magnetism of the superconducting material in the resonator can have a strong negative effect on the homogeneity of the $H_0$ field due to the short separation of the superconductor from the measuring sample, the surfaces of the individual superconducting conducting elements must be specially designed. One solution of prior art provides for the subdivision of all conductors into narrow strips to minimize the influence of magnetism to the greatest possible extent.

The Q of the resonator is also an important value which can influence the NMR spectrum. It should not be too high in order to keep transient and decay processes, mainly caused by the transmitter pulses, short for minimizing undesired artifacts in the NMR spectrum. Since the Q value is equal to the ratio $\omega L/R$, i.e. the impedance of the overall inductance of the resonator, divided by the overall resistance of all conducting paths, the inductance L of the resonator should be as small as possible for a given resistance R. This can be obtained by keeping only those inductances which are mainly responsible for generating the B1 field in the measuring sample, and by reducing or compensating for all others to the extent possible.

Moreover, the resonator should permit a second resonator to be mounted as close to the measuring sample as possible such that its magnetic field is orthogonal to that of the first for minimizing magnetic coupling between the two resonators. The resonance frequencies of the two resonators can either be the same or different. Of these two options, the latter is usually chosen and the second resonator serves to excite and/or receive signals from a second type of nucleus. Orthogonal resonator arrangements of this type are often used in NMR for special experiments.

In particular, two types of resonators are known, i.e. the coplanar Helmholtz resonator (see U.S. Pat. No. 5,585,723) and the hybrid resonator (see U.S. Pat. No. 6,121,776).

Coplanar Helmholtz Resonator

This resonator consists of two planar resonant circuits in a Helmholtz arrangement (see FIGS. 7 and 8) which are tuned to the same resonance frequency $f_0$ and which produce two resonant modes due to their strong inductive coupling, one below and the other above $f_0$. The mode with the lower resonance frequency is the only one which can produce a homogeneous $B_1$ field in the measuring volume. The other mode produces a highly inhomogeneous field and can therefore not be used as an NMR detector.

The opening angle α of the resonant circuit arrangement is usually selected to be 120° (see FIG. 7) to obtain the best homogeneity of the B1 field.

Since the coil consists exclusively of superconducting material, the losses are very small and the sensitivity could be very high were it not for other impairing factors. In particular, the planar geometry prevents the conducting paths from being placed in the direct vicinity of the measuring sample, therefore producing a correspondingly smaller B1 field at the location of the measuring sample. The sensitivity is consequently reduced.

The structure of each of the two resonant circuits is shown in FIG. 9. All conductors perform a dual function, namely generation of both the resonance inductance and the resonance capacitance of the resonant circuit. It can be shown that the largest possible average current through such conductors is only half of the critical current for the superconductor should the individual conductors have the same widths. The maximum B1 field which can therefore be obtained is likewise only half the size of the highest theoretically possible field. However, one would like to operate at the full critical current.

If, as is usually the case, the same resonator is also used for transmitting the excitation pulses, it is very important to obtain as high a current in the conductors as possible and therefore a maximum $B_1$ field since this determines the pulse width needed to obtain a desired NMR flip angle. Moreover, that pulse width should be as small as possible. The B1 field is halved by the effect described in the previous paragraph and is further reduced by the relatively large distance between the conductors and the measuring sample.

The large dimensions of the two resonant circuits caused by the planar geometry also causes the inductance of this resonator to be many times greater than the minimum possible inductance. These resonators have Q values of 30,000 and more. This leads to transient and decay processes, mainly caused by the transmitter pulse, which are of excessive time duration and which therefore cause distortions in the base line and generate undesired artifacts in the NMR spectrum.

The large size of the resonator has the additional consequence that there is little free space for providing additional resonators in the vicinity of the measuring sample. Moreover, the resonator conductors are located close to the shielding and are magnetically and electrically coupled thereto, thereby causing additional losses.

Hybrid resonator

This resonator is preferably designed as a birdcage resonator. It is constructed from massive superconducting conducting paths disposed in an optimized fashion around, and parallel to the axis of, the measuring sample. These conducting paths are capacitively connected to each other at both ends of the conducting paths via a normal-conducting, tubular element.

Since the conducting paths are disposed in close proximity to the measuring sample and act nearly purely inductively, without having to serve a capacitive function, they can carry the full critical current. These two factors allow the maximum $B_1$ field which can be generated in the sample volume to assume an optimum value. This resonator type also allows correspondingly optimum short pulse widths for a desired NMR flip angle.

Compared with the Helmholtz resonator which has purely superconducting resonant circuits, the overall loss resistance R of the hybrid resonator is slightly higher and its overall inductance L is much smaller, since the conducting paths closely surround the measuring sample. This produces a quality factor $Q=\omega L/R$ which is considerably smaller and therefore better than that of the Helmholtz resonator.

Although one might expect the higher overall losses of the hybrid resonator to produce a worse S/N ratio, this effect is compensated, or even overcompensated, by the fact that the conducting paths are located much closer to the measuring sample and therefore produce a much larger B1 field. In certain cases, S/N ratios which are higher than those of a Helmholtz resonator can be obtained.

The very compact construction permits optimum installation possibilities, in particular for measuring samples having large diameters, with which the amount of remaining free space can be very limited. However, for smaller diameters of the measuring sample, the somewhat complicated construction has structural limits.

In summary, the NMR resonator should have the following five important features:
1) It should have optimum sensitivity.
2) It should generate the desired NMR flip angles during the transmitting phase with as short pulse times as possible.
3) Its influence on the homogeneity of the stationary $H_o$ field in the region of the measuring sample should be as small as possible.
4) Its Q should not be too high, such that the transient and decay processes mainly caused by the transmitter pulses can be kept short to prevent generation of excessive artifacts in the NMR spectrum.
5) Its geometrical design should be such as to provide the space required for optimum installation of one or more orthogonal resonators.

Departing therefrom, it is the underlying purpose of the present invention to present a new class of superconducting NMR resonators which satisfy the above-mentioned requirements to present an improvement over prior art.

SUMMARY OF THE INVENTION

This object is achieved in accordance with the present invention in a surprisingly simple and effective manner in that each individual current-carrying resonant circuit on the planar substrate elements generates a magnetic field in the center of the measuring volume which is parallel to the plane of the planar substrate element on which the single resonant circuit is located, wherein the deviation from parallelism should not exceed 40 degrees.

The invention presents a manner of NMR resonator construction with improved sensitivity, minimized pulse widths for a given desired NMR flip angle, minimized resonator Q and therefore small spectral artifacts, as well as optimum space for installation of additional resonators in an orthogonal direction relative to the first resonator. Nearly all of these features constitute considerable improvements over prior art.

These resonators have excellent NMR properties and are also of simple construction to permit easy assembly, even with confined geometries.

Further advantages can be extracted from the drawing and the description. The features mentioned above and below can be used in accordance with the invention either individually or collectively in any arbitrary combination. The embodiments shown and described are not to be understood as exhaustive enumeration, rather have exemplary character for describing the invention.

The invention is shown in more detail in the drawing and is further explained with reference to embodiments.

BRIEF DESCRIPTION OF THE DRAWING

FIG. 15 shows the distribution of the current directions of the preferred resonant mode of the inventive resonator of FIGS. 3a, 3b, 6 to produce a homogeneous $B_1$ field in the measuring volume, wherein the direction of the $B_1$ field is approximately parallel to the flat plates on which the resonant circuits are mounted;

FIG. 16 shows the distribution of the current directions in the second resonant mode of the inventive resonator of FIGS. 3a, 3b, 6. It does not produce a homogeneous field in the measuring volume and is therefore not suitable as a resonator;

FIG. 17 shows the distribution of the current directions in the third resonant mode of the inventive resonator of FIGS. 3a, 3b, 6. It produces a less homogeneous and weaker field in the measuring volume than the configuration of FIG. 15 and the direction of the $B_1$ field is approximately perpendicular to the flat plates on which the resonant circuits are mounted;

FIG. 18 shows the distribution of the current directions in the fourth resonant mode of the inventive resonator of FIGS. 3a, 3b, 6. It does not produce a homogeneous field in the measuring volume and is therefore not suitable as a resonator;

FIG. 19 illustrates frequency tuning of the resonator by means of an inductive loop 12 and a trimmer 14a;

DESCRIPTION OF THE PREFERRED EMBODIMENT

Figure 2:
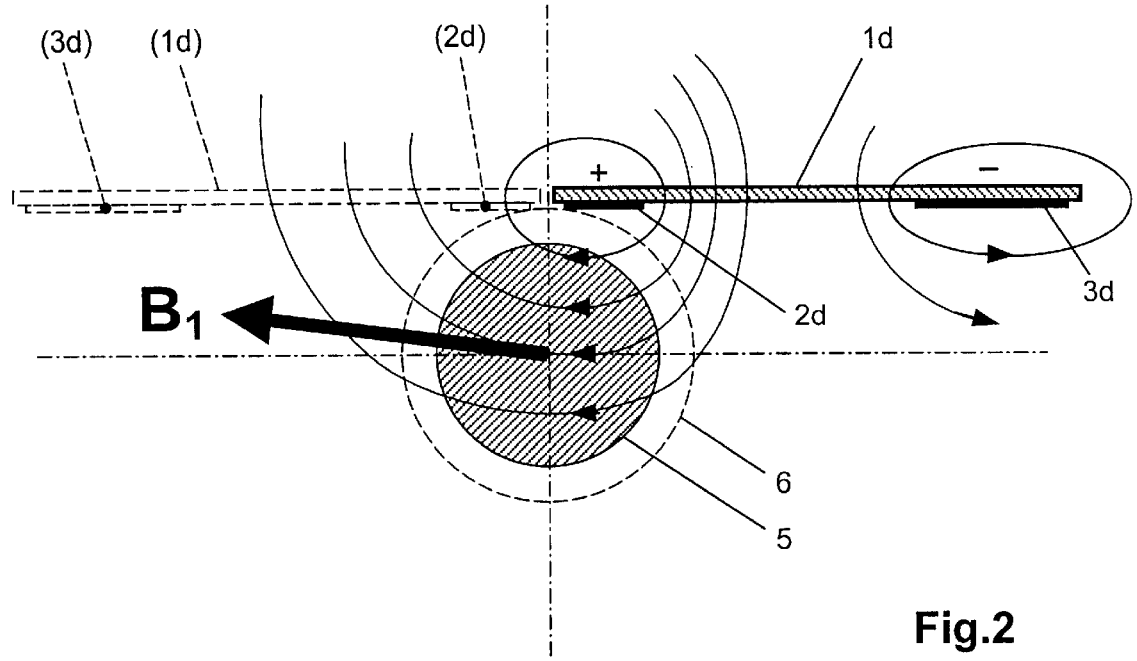
FIG. 2 shows a central structural element consisting of a plate 1d onto which a resonant circuit 2d, 3d is mounted, which is disposed relative to the measuring volume such that the $B_1$ field generated in the center of the measuring volume is approximately parallel to the plane of the plate.

All of the inventive resonators have the common feature that they are composed of several identical fundamental structural parts (structural elements) which are, in principle, all arranged as shown in FIG. 2. The structural element consists of a substrate plate 1d onto which a superconducting resonant circuit 2d, 3d is disposed as shown e.g. in FIG. 10a. For a given current through the resonant circuit, the structural element can produce an optimally large $B_1$ field in the center of the measuring volume. Moreover, the direction of the B1 field extends approximately parallel to the plane of the plate 1d, with the deviation from parallelism not exceeding 40°. To obtain these properties, a substantial part of the conductor on the plate must be located as close to the delimiting cylinder 6 as possible. Moreover, the structural element must be disposed approximately tangential to the delimiting cylinder 6.

The plate 1d shown in FIG. 2 is tangentially displaced towards the right-hand side. It is also possible to displace the plate tangentially towards the left as indicated with the broken lines in FIG. 2. It can be disposed at any location around the circumference of the delimiting cylinder 6. It is also possible to displace the plate, within narrower limits, tangentially towards or away from the measuring volume. In particular, as can be seen in FIG. 2, the plate 1d can be displaced towards the measuring volume in such a fashion that the conductors 2d come to rest perpendicularly above the center of the measuring volume, as is the case e.g. in the preferred resonator of FIGS. 3a, 3b.

Figure 3A:
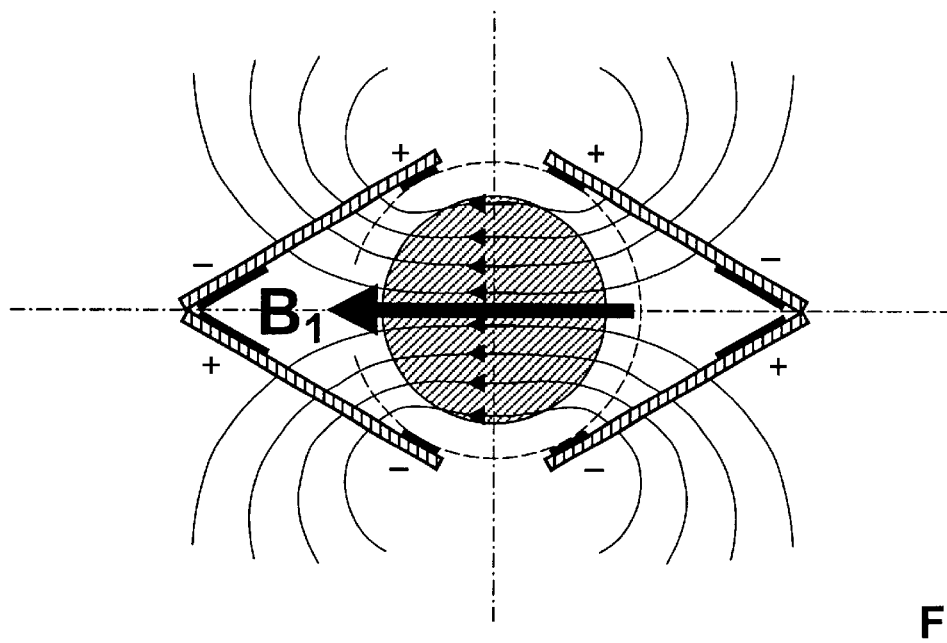
FIG. 3a shows a preferred inventive resonator (representation of the B1 field)
Figure 3B:
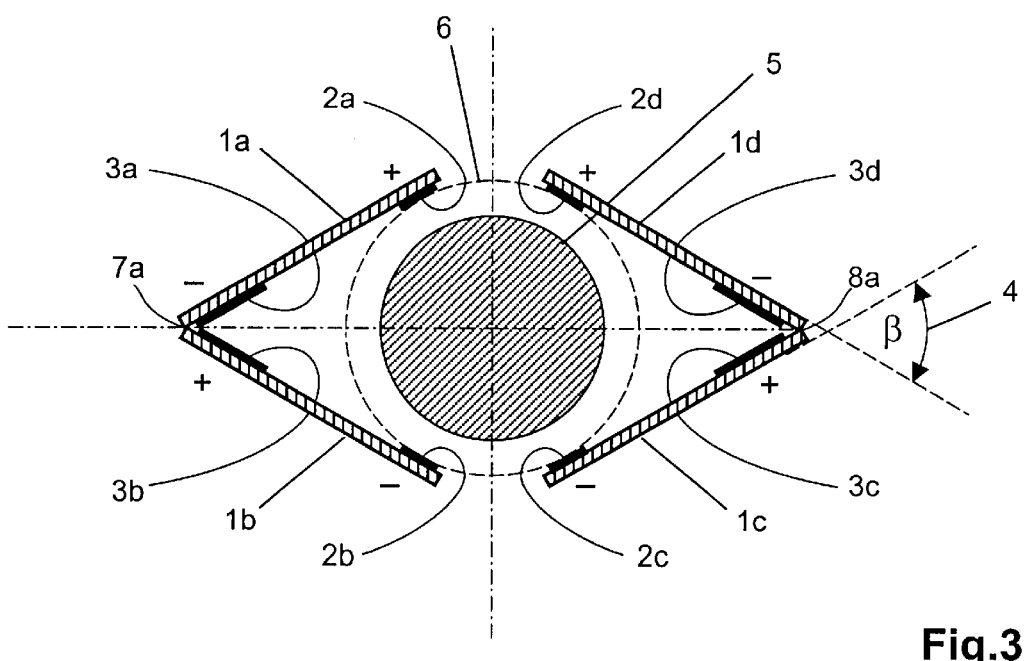
FIG. 3b shows a preferred inventive resonator (designation of the individual parts)
Figure 27:
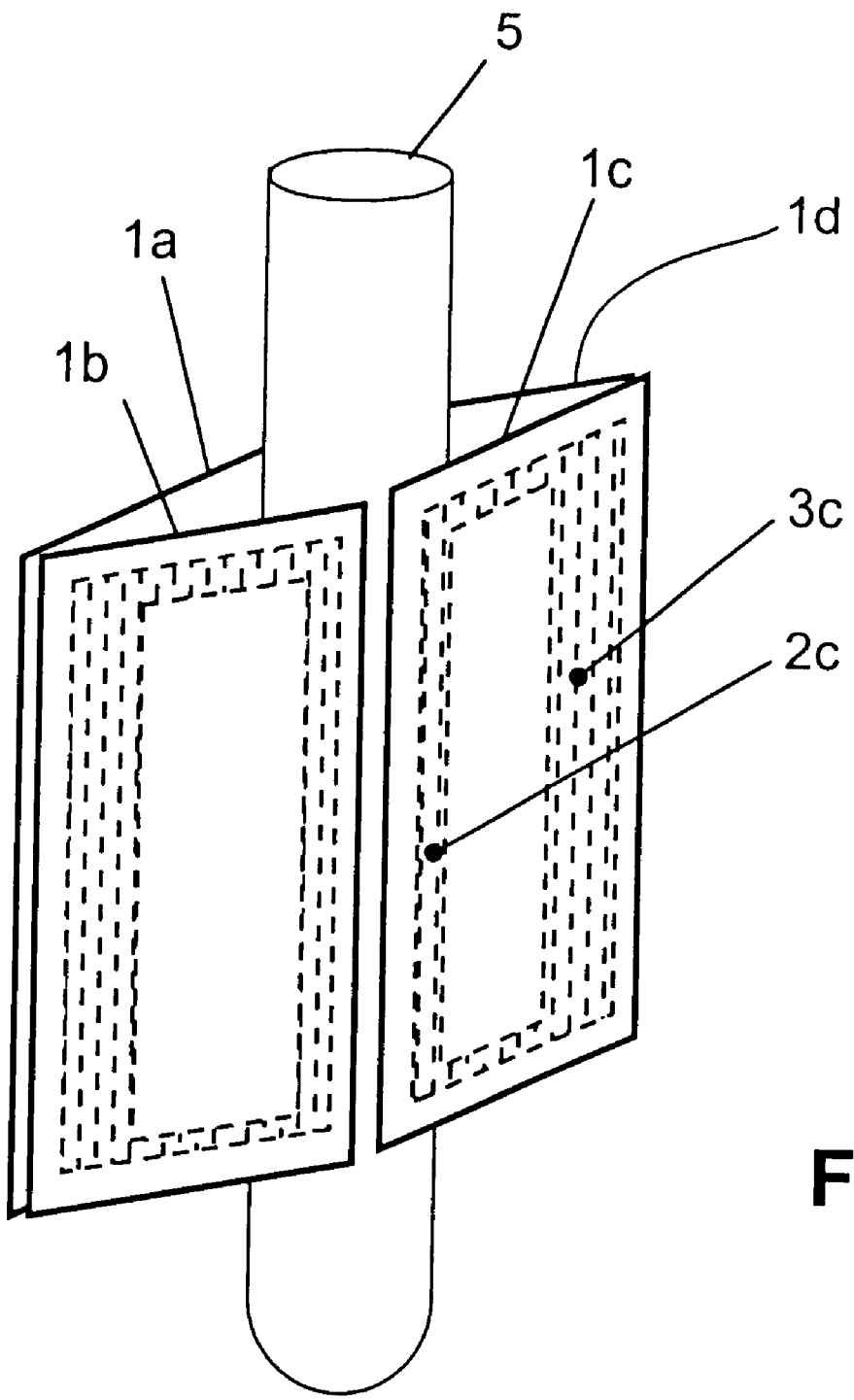
FIG. 27 shows the spatial distribution of the four plates 1a, 1b, 1c, 1d of the resonator of FIG. 3b.

FIGS. 3a, 3b show a preferred inventive resonator which is constructed from four structural elements 1a, 1b, 1c, 1d in accordance with FIG. 2. The associated conducting paths are designated with 2a, 3a, 2b, 3b, 2c, 3c, 2d, 3d, and the four plates form, in pairs, two V-shaped structures which are disposed diametrally and symmetrically about the measuring sample 5 (FIG. 27). The $B_1$ field produced by this resonator is shown in FIG. 3a.

Figure 4:
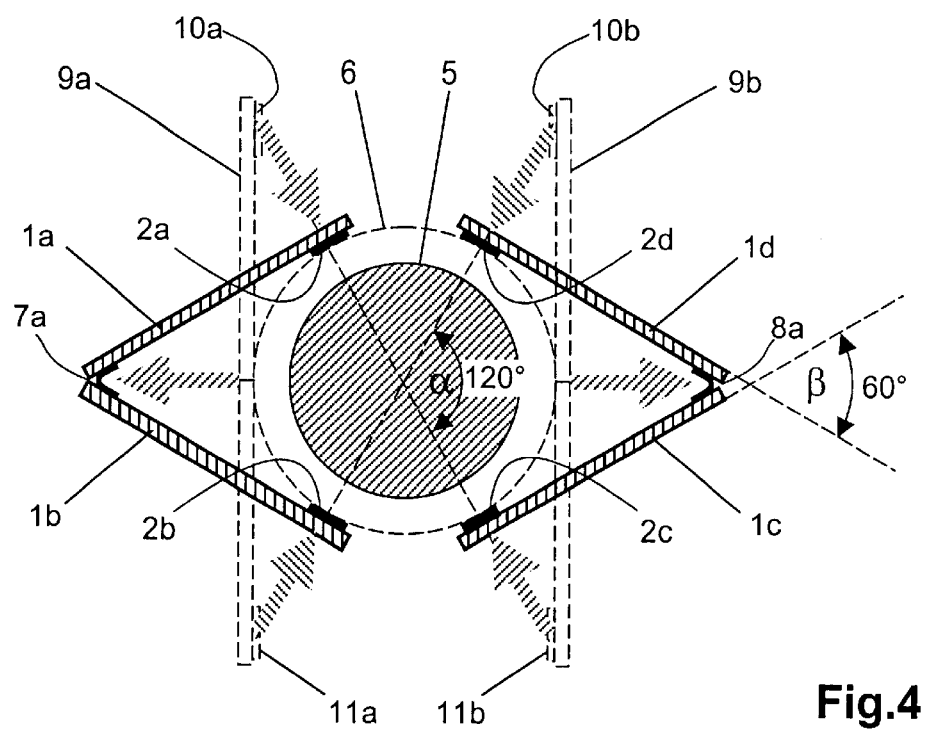
FIG. 4 shows how the first preferred inventive resonator of FIGS. 3a, 3b, 6 can be deduced from the conventional Helmholtz resonator of FIGS. 7, 8.

A simple and direct comparison of this resonator to the prior art according to U.S. Pat. No. 5,585,723 (see FIG. 7) can be effected through transformation of the arrangement of FIG. 7. The transformation process is shown in FIG. 4.

Starting from the two plates 9a and 9b with the superconducting conducting paths 10a, 11a and 10b, 11b, these plates are cut in the center, i.e. at those locations 7a and 8a parallel to the axis of the measuring sample 5 and held together with an imaginary hinge. This cut also separates the conductors which connect the conducting paths 10a, 11a and 10b, 11b and which are disposed perpendicular to the axis of the measuring sample.

The conductor paths 10a, 11a, and 10b, 11b are then tilted towards the measuring sample, wherein the points of intersection 7a and 8a migrate radially outwardly. This process is continued until the conducting paths contact the cylinder 6 representing the inner border of the cold volume, pairs of which form an opening angle α of approximately 120° (FIG. 4). The cut, connecting conductors are then electrically connected at the locations 7a, 7b, 8a, 8b thereby producing the arrangement shown in FIG. 5.

The opening angle α of 120° corresponds to the opening angle of a Helmholtz arrangement and produces as homogeneous a $B_1$ field as possible in the region of the measuring sample.

Figures 5, 6:
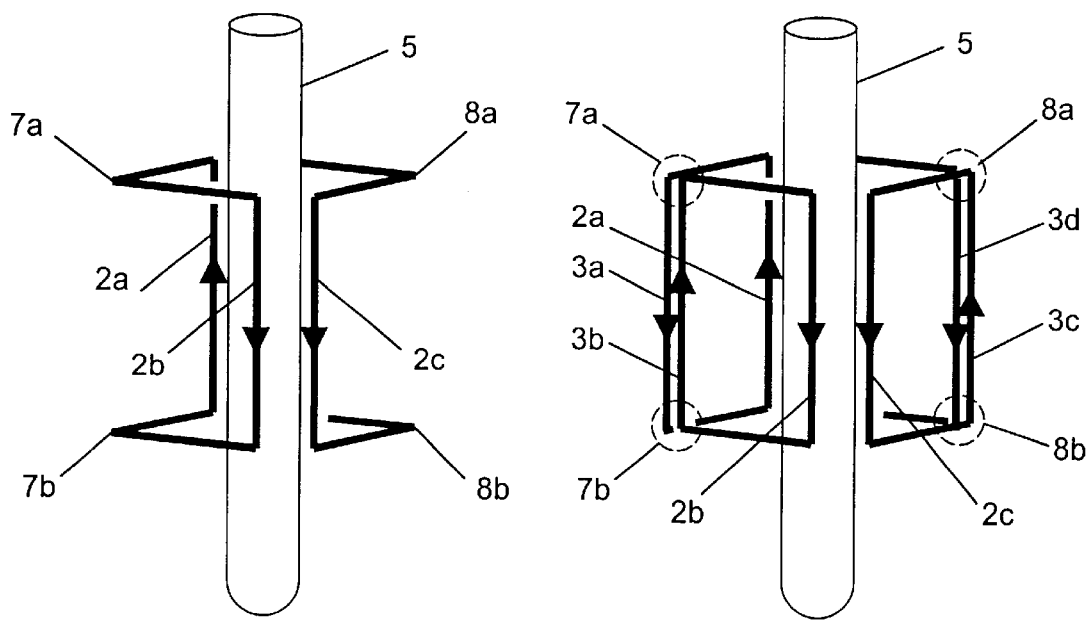
FIG. 5 shows the spatial dependence of the inventive resonator following transformation (FIG. 4). The resonator has low ohmic connections at locations 7a, 7b, 8a and 8b.
FIG. 6 shows the geometry of the preferred inventive resonator of FIGS. 3a, 3b.
Figure 8:
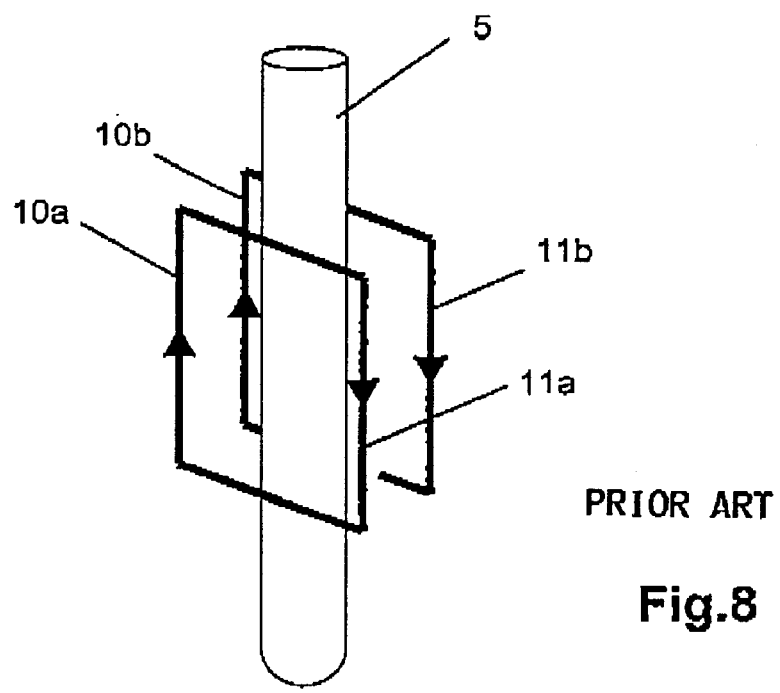
FIG. 8 shows the geometry of the Helmholtz resonator of FIG. 7.

A comparison between the original arrangement of FIG. 8 and the new transformed arrangement of FIG. 5, leads to the following observations:

The transformation has halved the distance between the conductors 2a, 2b, 2c, 2d and the measuring sample 5 (FIG. 4). Therefore, the $B_1$ field has been doubled, assuming that the geometry of the resonator has a much larger axial than radial extension, such that the field contributions of the connecting conductors transverse to the axis of the measuring sample can be neglected.

Since the overall length of the conducting paths has remained unchanged, the loss resistance R of the transformed resonator remains the same despite doubling of the $B_1$ field! Consequently, the factor $B_1(x,y,z)/l \cdot \mathrm{srt}(R)$ and therefore the S/N ratio has also increased by a factor of 2!

The homogeneity of the $B_1$ field remains optimized, since the opening angle of 120° was maintained (FIG. 4).

The inductance L of the resonator has been considerably reduced since the effective coil area was reduced. This also reduces the quality factor $Q=\omega L/R$ by the same factor as the inductance L, since R remains constant.

Figure 26:
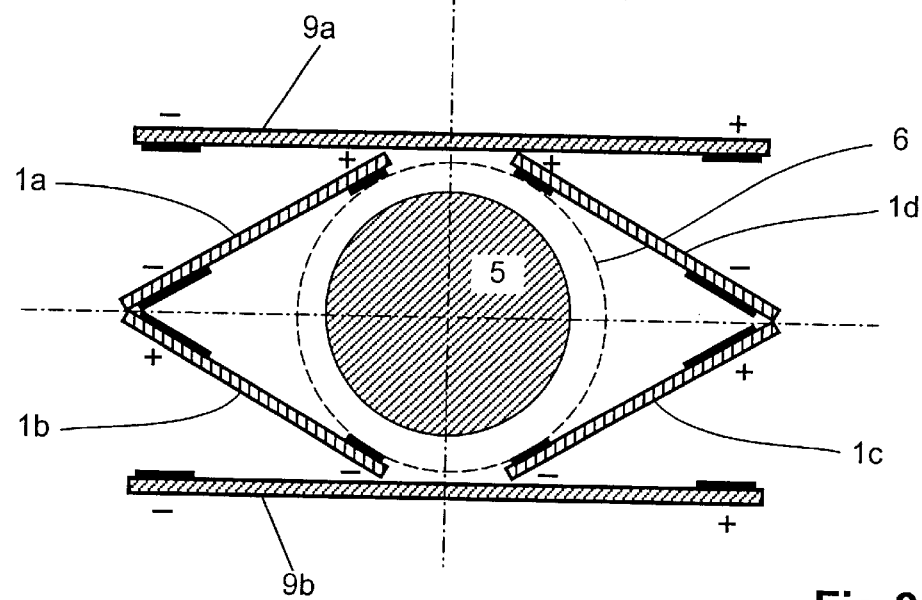
FIG. 26 shows two resonators, one in accordance with the preferred inventive arrangement of FIGS. 3a, 3b, 6 with the plates 1a, 1b, 1c, 1d and the other according to prior art in accordance with FIGS. 7, 8 with the plates 9a, 9b. Both resonators are positioned orthogonal to each other.

Moreover, the size has also decreased and an additional orthogonal coil can be easily mounted and positioned relatively close to the measuring sample (FIG. 26).

The cut transverse conductors which are intended to connect the conductors 2a, 2b and 2c, 2d can be electrically reconnected at the four locations 7a, 7b, 8a, 8b (FIG. 5) either with a superconductor or with a normal conductor. In particular, the normally conducting connections are a possible and inexpensive solution since the connections themselves can be very short and their resistances therefore negligible. This approach has been proposed in DE 197 33 574 A1 and can be applied as an intermediate variation toward the inventive resonators.

Galvanic connections of this type are not absolutely necessary to close the circuits on the plates 1a, 1b, 1c, 1d.

Instead of guiding the current from one of the plates in V-shape arrangement to the other, the current can be returned on the same plate, parallel to the edge of the interface. This produces the preferred embodiment of FIGS. 3a, 3b, 6 which can be produced in a simpler and more reproducible fashion than the embodiment of FIGS. 4, 5. The two currents along the edges 7a–7b and 8a–8b are oppositely directed such that the magnetic fields they produce nearly completely cancel. The generated fields are therefore practically identical to those of FIG. 5 and the overall inductance of the two arrangements is therefore also practically the same. Only the loss resistance R is different since the arrangement of FIG. 6 includes four longitudinal conductors more than FIG. 5, i.e. 3a, 3b, 3c and 3d, and therefore has a larger loss resistance.

Assuming that the resonant circuits on the individual plates are twice as long as wide, the resistance increases by a factor of 24/16=1.50, and the Q value decreases by a factor of 1/1.50=0.67. The S/N ratio also decreases by a factor of sqrt(0.67)=0.82. In view of the above mentioned gain in the S/N ratio of a factor of 2, these losses of 18% are no longer that important. Moreover, these 18% losses can be largely compensated for by the additional measures described below.

The additional conductors 3a, 3b, 3c, 3d can be used for producing the overall capacitance of the resonant circuit. These conductors are disposed at a relatively large separation from the measuring sample. This provides more space for realizing this capacitance, improves voltage stability, and allows more design variations.

On the other hand, the remaining conductors, i.e. in particular the conductors 2a, 2b, 2c, 2d can be exclusively used to produce the $B_1$ field and can be dimensioned to carry the highest possible current, i.e. the critical current, and to thereby produce the largest possible $B_1$ field. The current in the conductors which are also responsible for generating the capacitance of the resonant circuit, is linearly reduced from the full value to zero, so that these conductors therefore carry, on the average, only half the current, i.e. not more than half the critical value. This current reduction does not take place in any of the other conductors such that the full critical current can flow there, i.e. a factor of 2 more.

It can also be shown that the loss resistance of a conductor arrangement having an overall width b which, in addition to its inductive effect also acts as resonator capacitance, is larger by a factor of 4/3=1.33 than one also having an overall width of b but acting only inductively. This also results from the fact that the current in the conductor having the additional capacitive effect decreases and increases linearly and, for determining the total loss performance at a predetermined current by integration over the length of the conductor, one obtains the above mentioned effective resistance of $R \cdot (4/3)$.

The doubling of the $B_1$ field per current in the conductor bundle discussed several paragraphs above, achieved by disposing part of the conductors a factor of 2 closer to the measuring volume, together with the factor of 2 discussed two paragraphs above, result in an overall increase in the maximum possible B1 field by a factor of 4. This allows for a four-fold reduction of the required pulse width to obtain a desired NMR flip angle.

Figure 9:
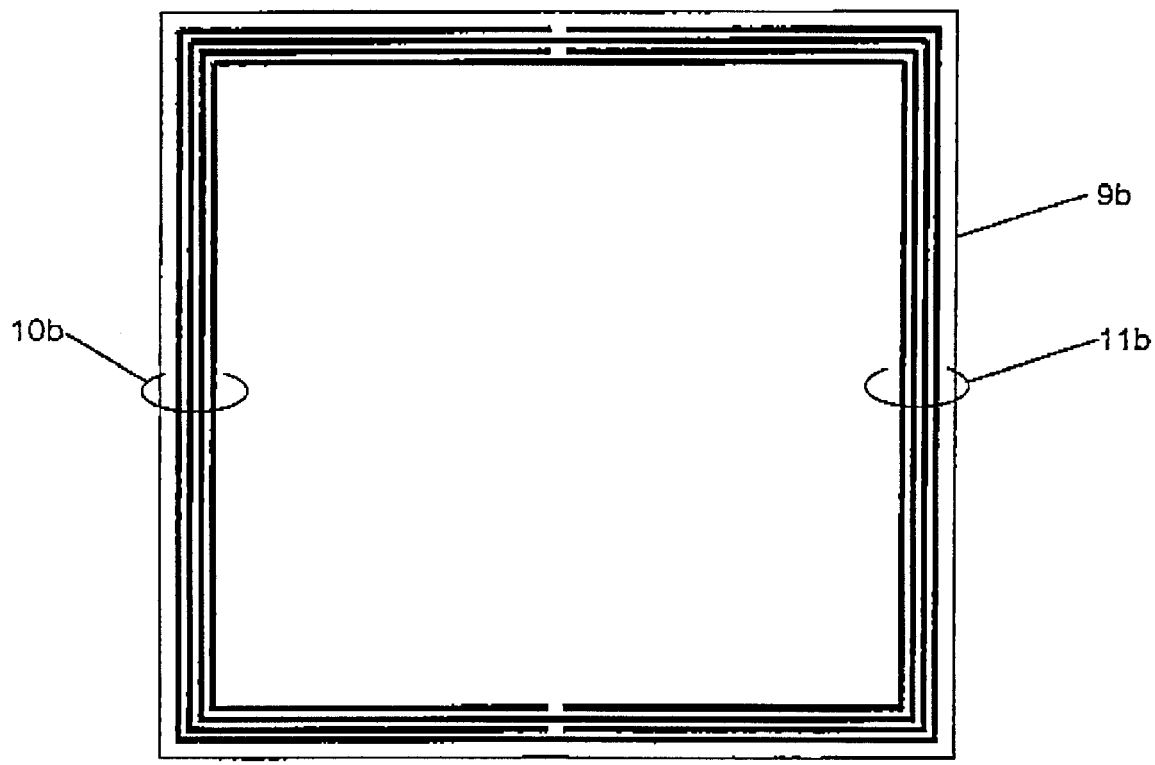
FIG. 9 shows one of the two resonant circuits of the Helmholtz resonator of FIG. 7. The resonator capacitance is distributed uniformly over the entire circumference.

FIG. 9 shows a resonant circuit in accordance with prior art (FIG. 8) wherein all conductors act both inductively and capacitively. The corners of the conductor arrangement are represented as squares for simplicity, but could also be rounded to prevent an increase in the current densities in the corners and therefore a reduction in the critical current for the conductors.

Figure 10A:
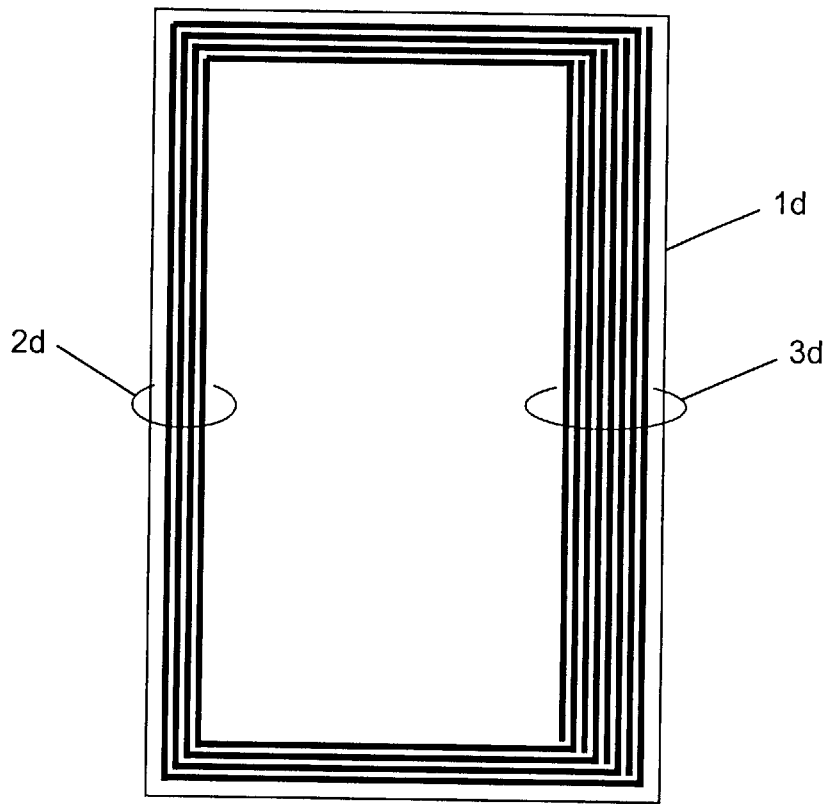
FIG. 10a shows one of the four resonant circuits of the inventive resonator of FIGS. 3a, 3b, 6. The resonator capacitance is separated from the field generating conductors and is located far away from the measuring volume.

FIG. 10a shows an inventive resonant circuit. The larger part of the conductors acts purely inductively (2d) and the resonance capacity is realized by the connecting conductors 3d. These connecting conductors, which are both inductive and capacitive, are disposed far away from the measuring sample and have an overall width which is twice as large as that of the conductors 2d. Also in this case, all corners of the conductor arrangements can be rounded.

The loss resistance R of the two resonant circuits can be calculated by means of FIG. 9 (prior art) and FIG. 10a (inventive arrangement) and be directly compared. It should thereby be assumed that the width of the resonant circuit of FIG. 10a is only half the size and its length the same size as that of the resonant circuit of FIG. 9. Since the known resonator (FIG. 9) has two individual resonant circuits, however, the inventive resonator (FIG. 6) has four, the losses of two resonant circuits according to FIG. 10a must be compared with the resonant circuit of FIG. 9. One obtains for the resonant circuit of FIG. 9:

$$R=(s \cdot R'/n)(1.333)$$

and for that of FIG. 10a, which must be doubled:

$$R=2 \cdot (R'/n) \cdot (s/8+s/4+s/8)+2 \cdot (R'/2n) \cdot (s/4) \cdot (1.333)=(s \cdot R'/n)(1.333)$$

wherein s=average circumference of the conductor arrangement of FIG. 9

Figure 10B:
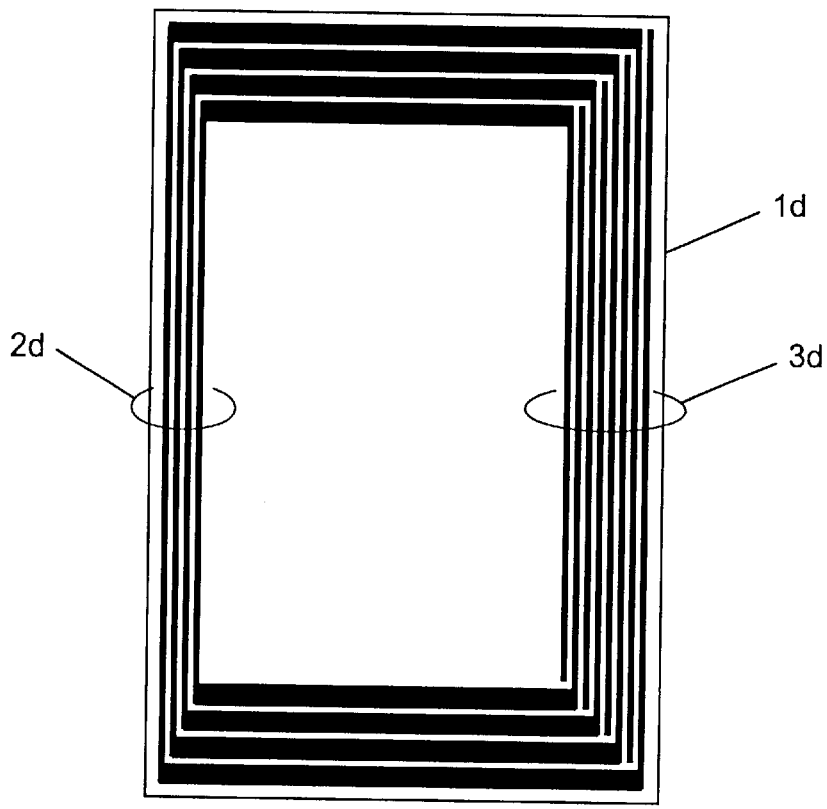
FIG. 10b shows the resonant circuit of FIG. 10a, however, with broadened conductors in the transverse connections of the resonant circuit.

R'=resistance per length unit of one individual conductor n=number of conductors in the conductor arrangement of FIG. 10b or 2d The result shows that both arrangements have the same loss resistance R.

As was shown above, the four additional connecting conductors 3a, 3b and 3c, 3d of the inventive resonator of FIG. 6 cause an increase in the loss resistance by 18% compared to prior art (FIG. 8) when the resonant circuits are used in accordance with prior art (FIG. 9). The above calculation shows that this increase of the loss resistance can be almost completely compensated for in the new, inventive resonant circuit of FIG. 10a.

Figure 11:
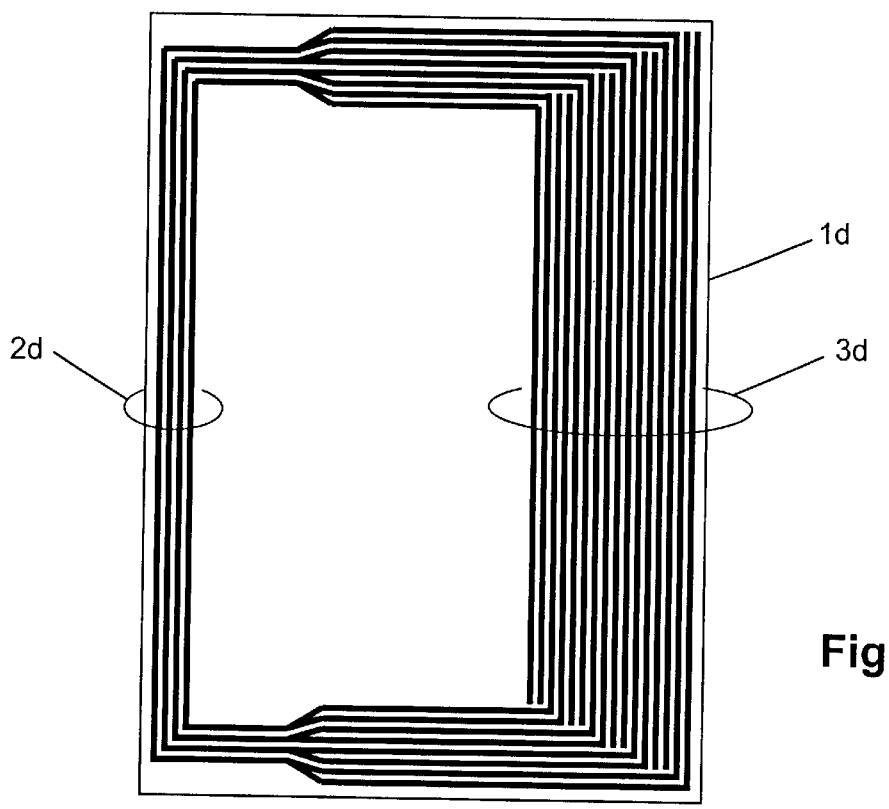
FIG. 11 shows a further variant of the inventive resonant circuit of FIG. 10a wherein all conductors which are located at a sufficient distance from the measuring volume, are branched off into two conductors to reduce the loss resistance. The fingers of the resonance capacity engage each other in pairs.
Figure 12:
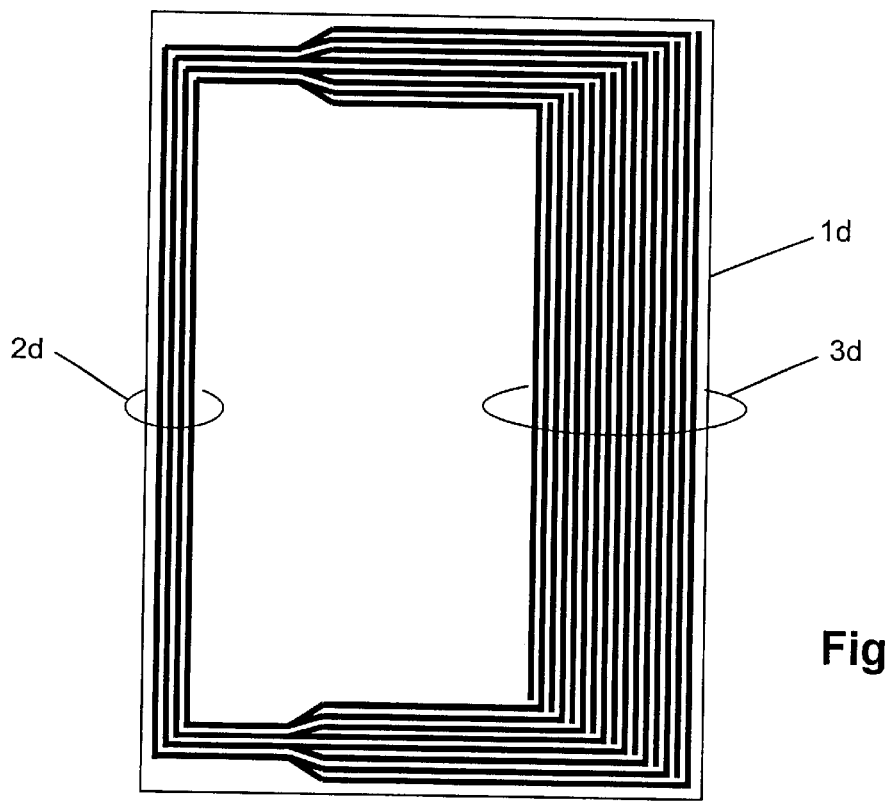
FIG. 12 differs from FIG. 11 in that the fingers of the resonator capacitance individually engage each other.

To further reduce the loss resistance R, the conductor portions which are not in the direct vicinity of the measuring sample can be widened (FIG. 10b) and/or branched into several lines (FIG. 11 and FIG. 12). In this case as well, all corners of the conductors can be rounded. FIG. 11 and FIG. 12 differ with regard to the arrangement of the conductors 3d. In FIG. 11, the fingers of the capacitances engage each other in pairs such that the overall capacitance is similar to that of FIG. 10a. In FIG. 12, however, the fingers are individually disposed next to each other to substantially double the capacitance. It is also possible to design one part of the conductors 3d as in FIG. 11 and to design the other conductors 3d as in FIG. 12, to permit wide variations in the capacitance of the resonator. In addition, the lengths of the individual conductors 3d which reach the upper and lower transverse conductors in FIGS. 10a, 10b, 11 and 12 can be shortened thereby substantially reducing the overall capacitance of the resonant circuit.

Figure 19:
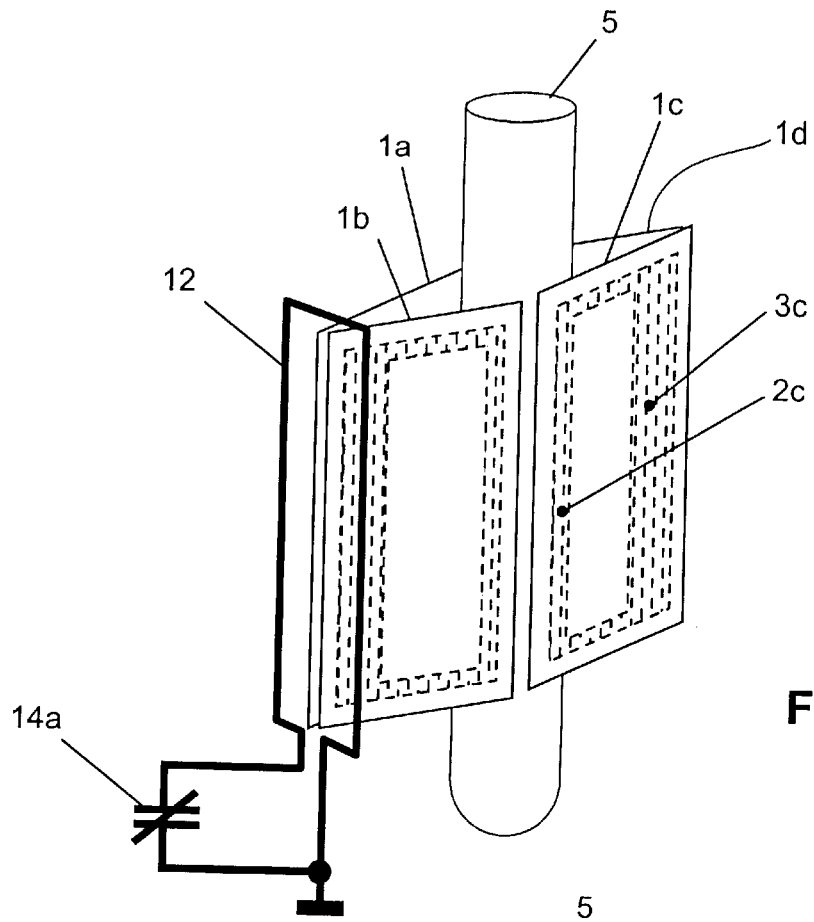
Figure 20:
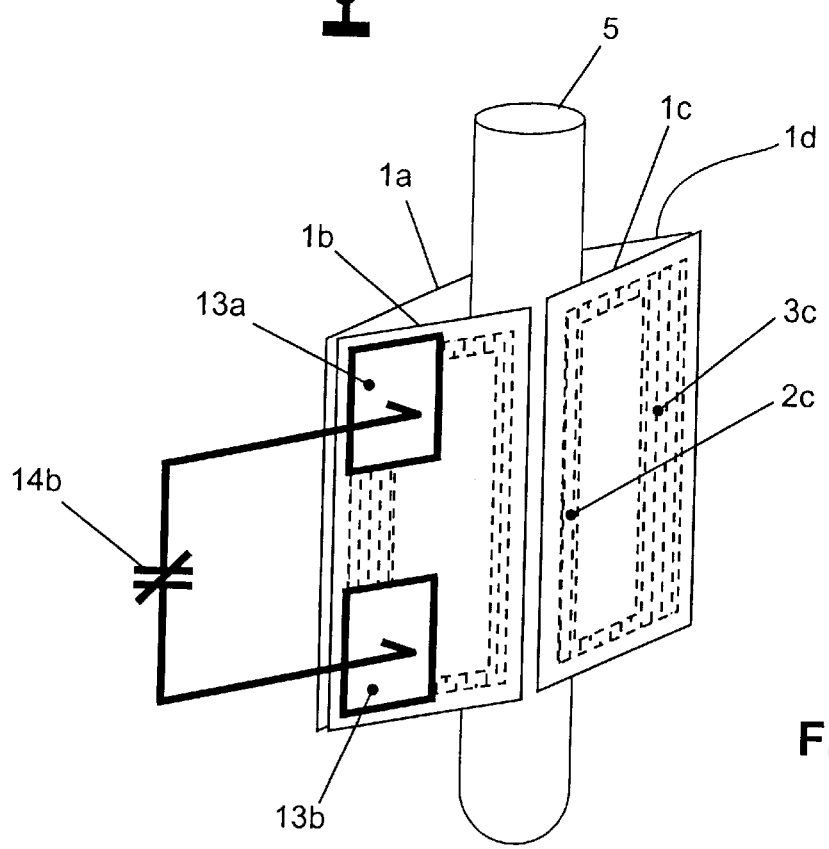
FIG. 20 illustrates frequency tuning of the resonator by means of two capacitive plates 13a, 13b and the trimmer 14b.

The frequency tuning of the resonator can be easily carried out either inductively by means of a loop 12 and the trimmer 14a (FIG. 19) or capacitively by means of two capacitor plates 13a, 13b and the trimmer 14 (FIG. 20). Since the tuning elements are disposed at a large distance from the measuring sample, their influence on the electric and magnetic conditions at the location of the measuring sample is quite small and they do not substantially inhibit mounting of possible further orthogonal resonators.

Figure 21:
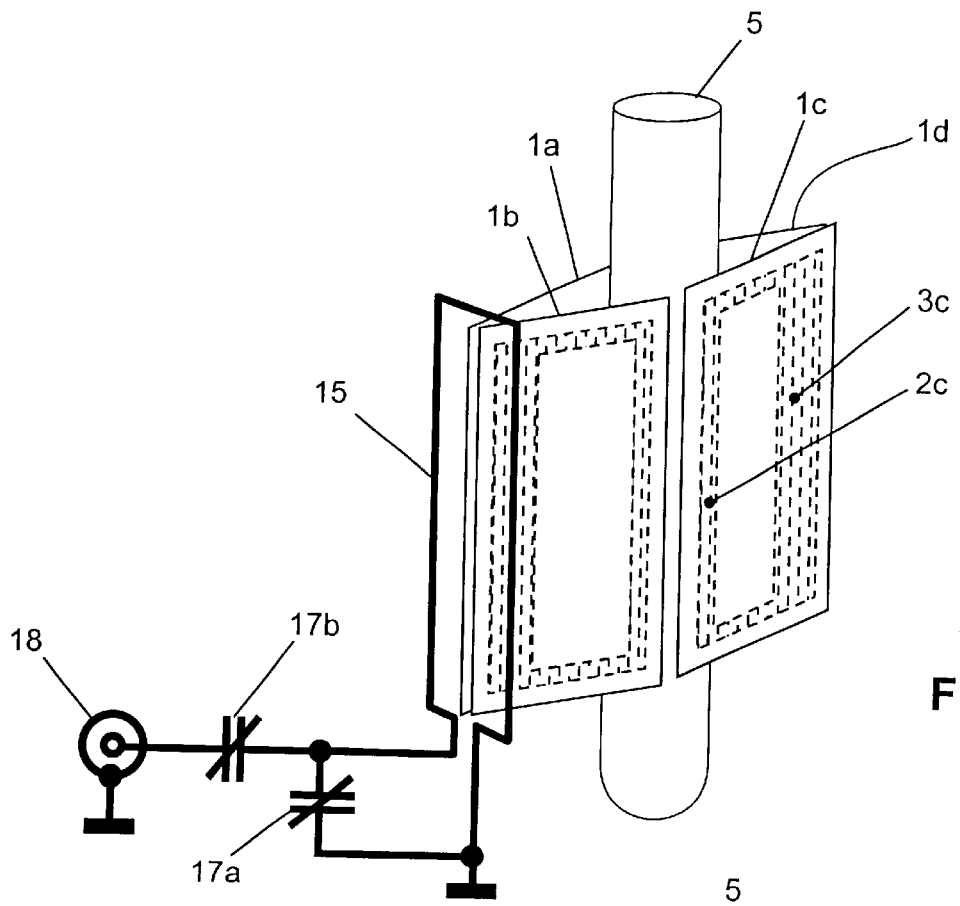
FIG. 21 shows input coupling of the transmitter pulses or output coupling of the NMR signal by means of an inductive loop 15 and two trimmers 17a, 17b.
Figure 22:
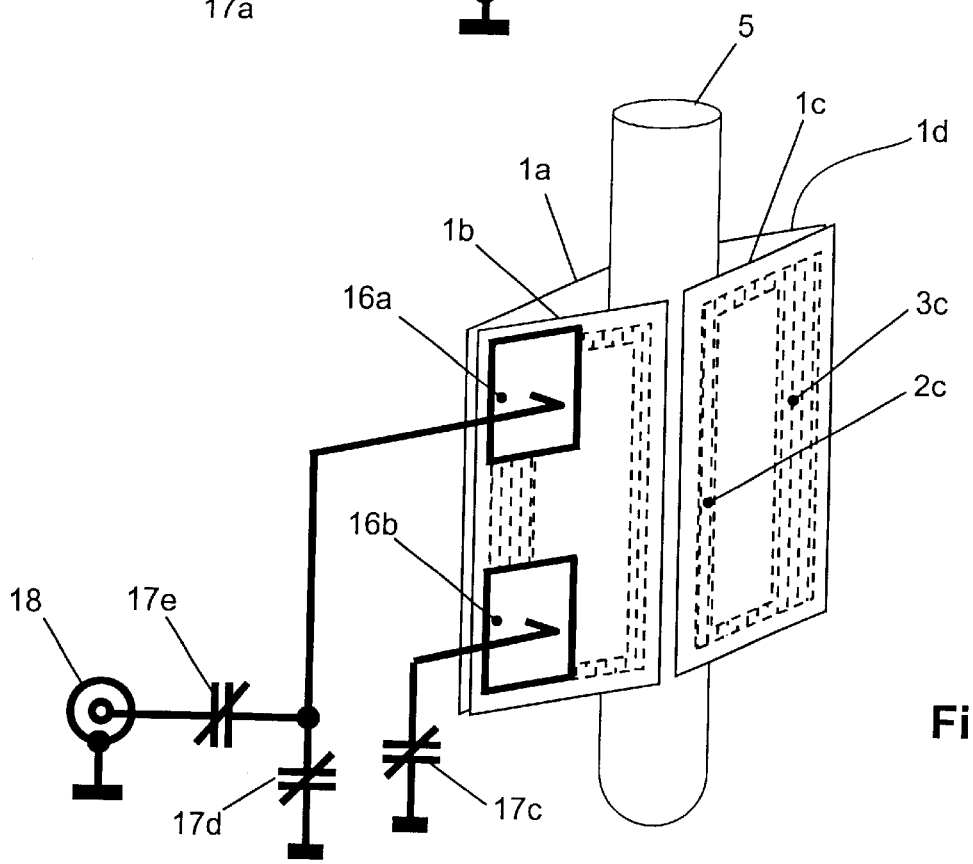
FIG. 22 shows input coupling of the transmitter pulses or output coupling of the NMR signal by means of two capacitive plates 16a, 16b and three trimmers 17c, 17d, 17e.

Input coupling of the transmitter pulse and output coupling of the NMR signal can be carried out either inductively by a loop 15 and e.g. two trimmers 17a, 17b (FIG. 21) or also capacitively with two capacitor plates 16a, 16b and e.g. three trimmers 17c, 17d, 17e (FIG. 22). The capacitances 17a, 17b and 17c, 17d, 17e serve for adjusting the impedance between the coaxial cable connected to the plug 18 and the resonator. The frequency of the transmitter pulse determines the resonant mode excited in the resonator. The coaxial cable which is connected to the plug 18 is responsible for the electric connection between the low-noise pre-amplifier and the resonator. The coupling elements are also disposed far away from the measuring sample in the region of the conductors 3a, 3b or 3c, 3d to keep the magnetic and electric influence on the measuring sample as small as possible.

The tuning and coupling variants described above could be replaced by many other variants known from the literature.

Resonators which are composed of several resonant circuits generally have a plurality of resonance frequencies, called resonance modes. If the resonant circuits all have approximately the same inherent resonance frequency $f_0$ and are located in spatial proximity to each other, they can couple strongly such that the resonator has several different resonance frequencies. They are distributed above and below $f_0$ and the frequency $f_0$ itself no longer occurs as resonance frequency of the resonator. The different resonance frequencies have differing associated current distributions in the individual resonant circuits. With n resonant circuits, n different current distributions and therefore n resonance modes are possible. Only one of these modes is used, i.e. the one which produces the desired homogeneous field and which has the best NMR properties.

Figure 13:
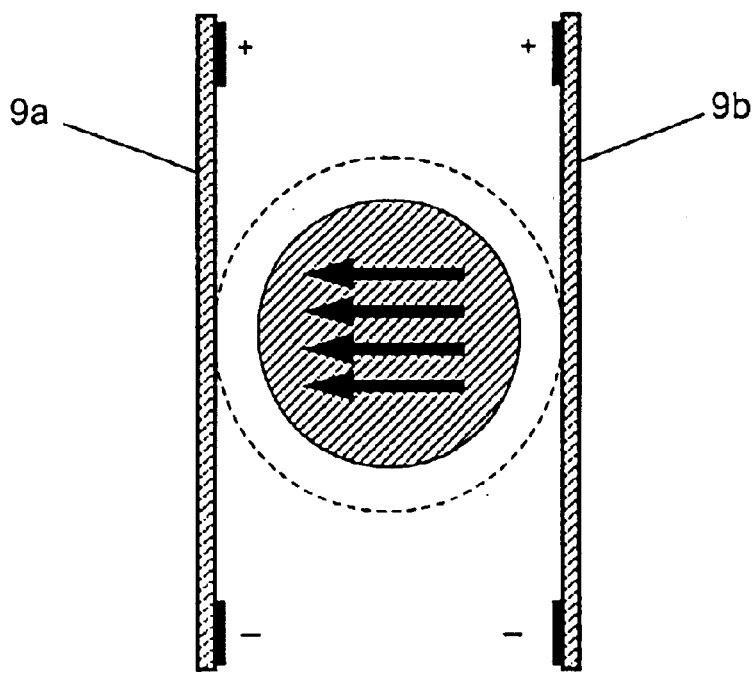
FIG. 13 shows the distribution of the current directions in the useful resonant mode of the Helmholtz resonator of FIGS. 7, 8 to produce a homogeneous $B_1$ field in the measuring volume.
Figure 14:
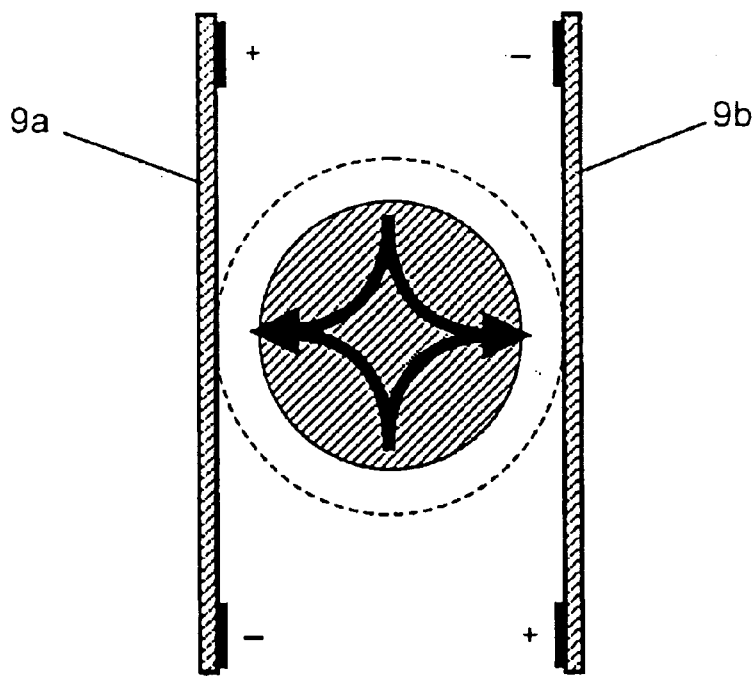
FIG. 14 shows the distribution of the current directions in the second resonant mode of the Helmholtz resonator of FIGS. 7, 8 which does not produce a homogeneous $B_1$ field in the measuring volume and which is therefore not suitable as a resonator.

The Helmholtz arrangement of FIG. 8 has two possible current distributions and therefore two modes. These are shown in FIGS. 13 and 14. It should be noted that the magnitudes of the currents must be equal for reasons of symmetry. The preferred mode has a resonance frequency which is below the characteristic resonance frequency $f_0$ of the resonant circuits and which is shown in FIG. 13. It produces a homogeneous field in the measuring volume which is perpendicular to the plates 9a and 9b. This mode is used for NMR resonators in accordance with prior art. The second mode (FIG. 14) has a higher resonance frequency but is not suitable as an NMR resonator since it produces a highly inhomogeneous field in the measuring volume.

The resonator of FIG. 6 is preferred in accordance with the invention. It has four possible current distributions in the four resonance circuits and therefore four modes (shown in FIGS. 15, 16, 17, 18). The magnitudes of the currents must also be equal for reasons of symmetry. The preferred mode is shown in FIG. 15. It has a resonance frequency which is above the characteristic resonance frequency $f_0$ of the resonant circuits and produces a field in the measuring volume which extends approximately parallel to the plates 1a, 1b, 1c, 1d. FIG. 17 also shows a usable but less optimal mode with a field in the measuring volume which extends almost perpendicular to the plates, and a resonance frequency which is below $f_0$. The other two modes of FIGS. 16 and 18 are not suitable for NMR resonators since they produce i.a. a strongly inhomogeneous field in the measuring volume.

For an inventive resonator according to FIGS. 3a, 3b, 6 having an angle β of 26° instead of 60° and having a characteristic inherent resonance frequency $f_0$ of the resonant circuits of approximately 360 MHz, the following resonance frequencies were measured for the four modes:

| Mode | $f_1$ | $f_2$ | $f_3$ | $f_4$ |
|---|---|---|---|---|
| Associated FIGURE | FIG. 17 | FIG. 18 | FIG. 15 | FIG. 16 |
| Res freq. [MHz] | 298.631 | 322.434 | 415.832 | 476.988 |

Up to now we have only dealt with the theoretical construction of resonators. In concrete embodiments all important parameters, e.g. conductor widths, position of the conductor, size of the windows of the resonance circuits and the opening angle β must advantageously be numerically optimized and adjusted to the particular task. Exact calculations show that achievement of the desired factor of 2 in the S/N ratio depends, in practice, on a careful dimensioning of all important parameters.

Figure 1:
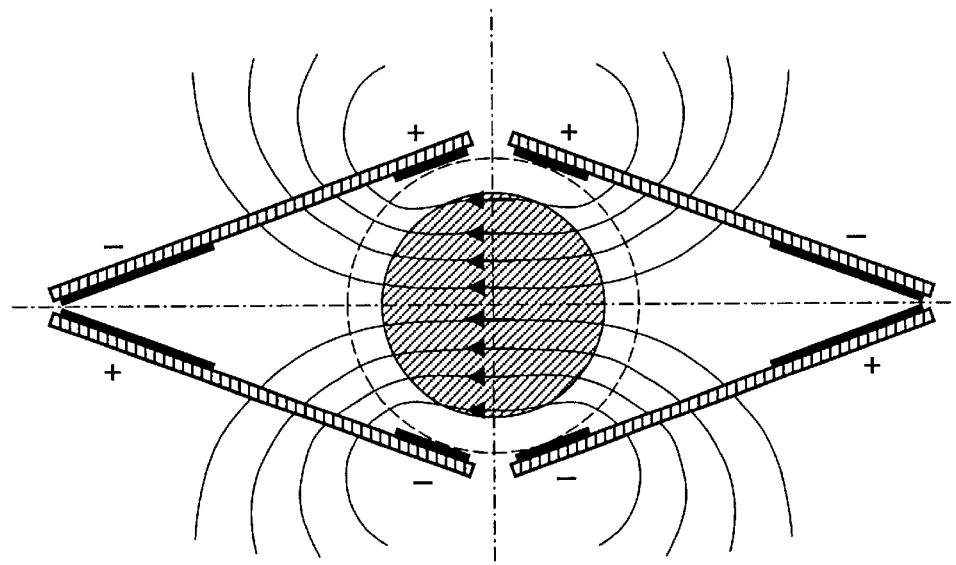
FIG. 1 shows the preferred form of the inventive resonator. Compared to the first preferred embodiment of FIG. 3b, it has an opening angle β of less than 60°.

The concrete, optimized configuration depends most importantly on the length to diameter ratio of the sample volume. In particular, precise calculations show that it is often advantageous to slightly reduce the opening angle β of 60°, as shown in FIG. 1. The plates 1a, 1b, 1c, 1d thereby widen such that the conductors facing away from the sample can also be wider with less resistance. The smaller opening angle β permits closer angular proximity of the conductors such that their fields better cancel, as desired. The exact width of the field-generating conductor paths in the direct vicinity of the measuring sample must also be determined very precisely to obtain optimum values for the strength and homogeneity of the $B_1$ field. This produces the most preferred version of the inventive resonator (FIG. 1).

In addition to the two preferred resonators of FIG. 1 and FIGS. 3a, 3b, 6, further forms of resonators are possible which utilize the inventive structural element of FIG. 2.

Figure 23:
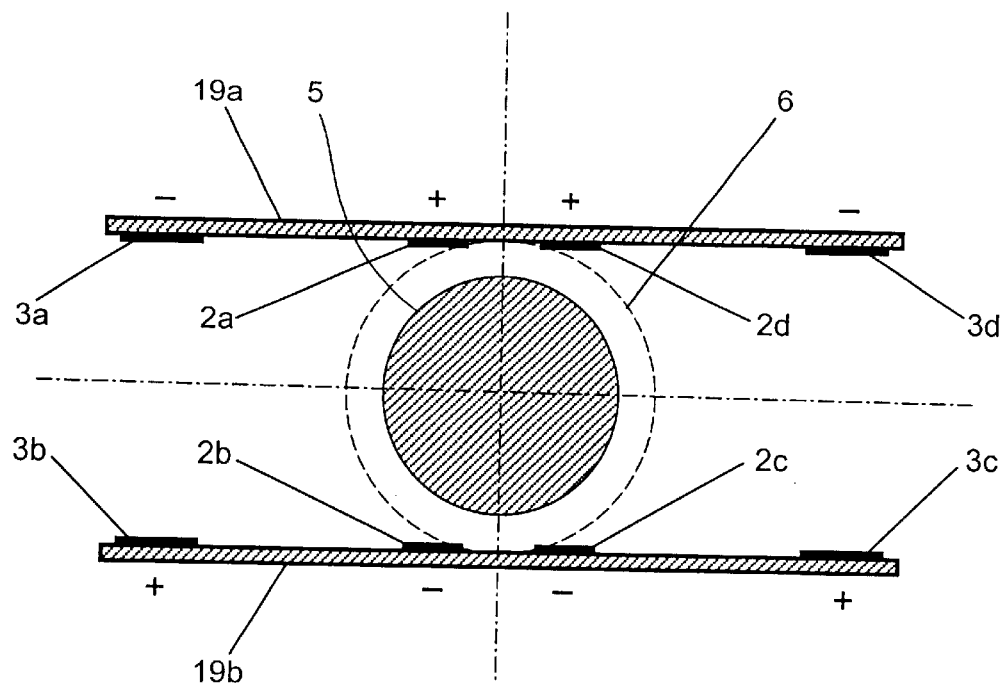
FIG. 23 shows the inventive resonator which was derived from the preferred resonator of FIGS. 3a, 3b, 6. It requires only two plates 19a, 19b and has an opening angle β of 0°.

1. The opening angle β is set to 0°. This is the degenerate case, with which two structural elements are joined into one single structural element (FIG. 23). This produces some small losses in the field homogeneity, in the S/N ratio, in the maximum possible $B_1$ field and in the minimum inductance. This arrangement is nevertheless superior to the Helmholtz coil pair of FIGS. 7, 8. The advantage of this arrangement consists in its simplicity and the available space between the two flat plates. This arrangement also offers sufficient free space for adding further outer resonators.

Figure 24:
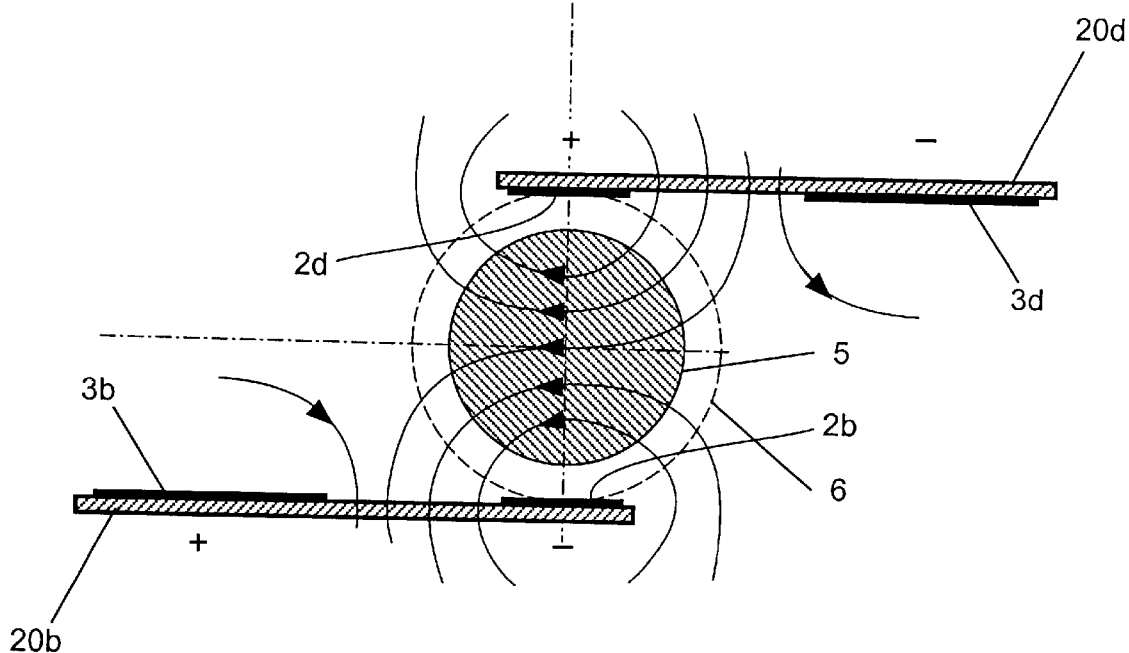
FIG. 24 shows an inventive resonator consisting of only two plates 20b, 20d in a point-symmetrical arrangement.

2. Two structural elements can be removed from the four structural elements in each of FIGS. 3b and 23 to produce the point-symmetrical arrangement of FIG. 24. This produces a loss in the S/N ratio of slightly less than the square root of ½, however, practically no reduction in the maximum possible $B_1$ field. A resonant mode is used in which the currents in the two conductors located closest to the measuring sample are opposed. The magnitudes of the currents are also equal for reasons of symmetry.

Figure 7:
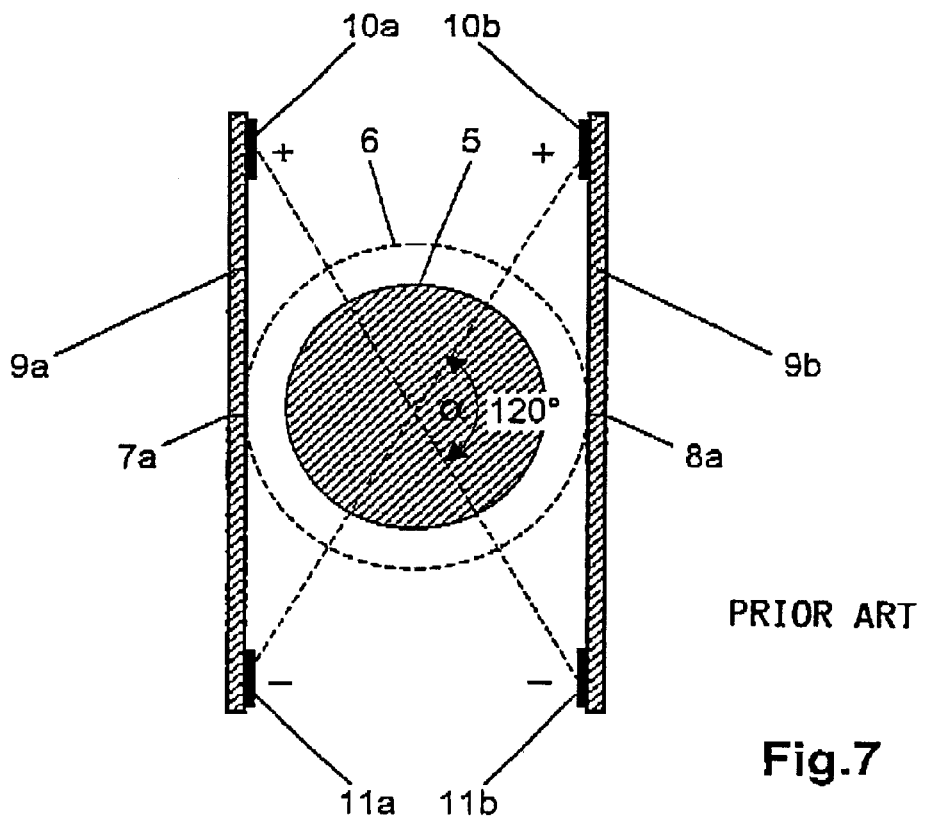
FIG. 7 shows a Helmholtz resonator according to prior art.

All these inventive resonators provide sufficient space for adding further resonators which can be disposed close to the measuring sample, orthogonal to the first resonator. In this manner, the following double resonator arrangements are produced:

1. A second resonator in accordance with FIGS. 7, 8 is disposed outside of the resonator of FIGS. 3a, 3b, 6. This produces the two resonator arrangement shown in FIG. 26. The two fields $B_1$ and $B_2$ generated by the first and second resonator in the center of the measuring volume are perpendicular to each other. It should be noted that the second resonator 9a, 9b (FIG. 26) is also very close to the limiting cylinder 6 and therefore nearly optimally arranged.

2. With the resonator of FIG. 23, it is also possible to dispose a second resonator 9a, 9b very close to the limiting cylinder 6, analogous to 1. above. In this case it is even possible to also mount the second resonator at the outside or inside of the two plates 19a, 19b (FIG. 23). The two fields B1 and B2 produced by the first or second resonator in the center of the measuring volume are also disposed perpendicular to each other.

Figure 25:
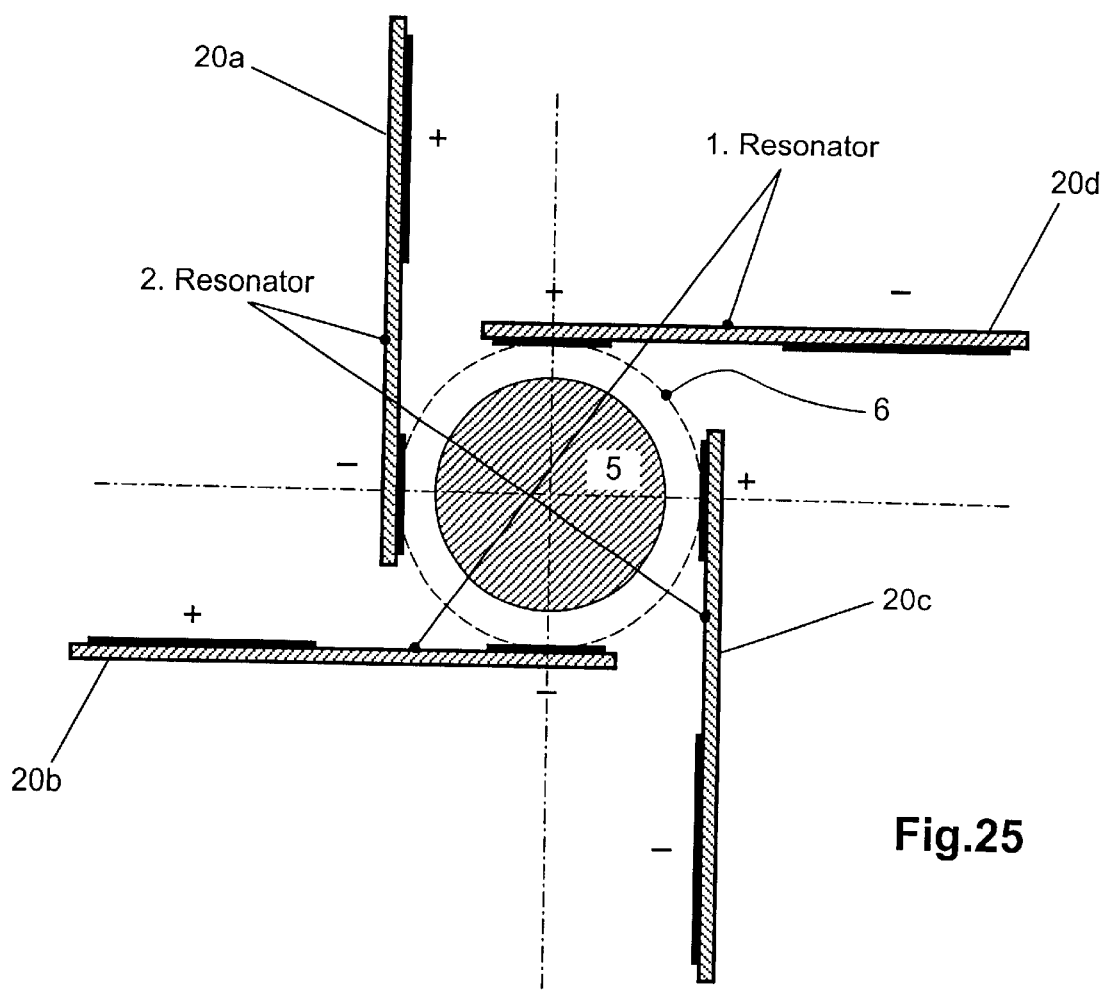
FIG. 25 shows two resonators according to FIG. 24 which are rotated by 90° with respect to each other, i.e. are orthogonal to each other.

3. A further identical resonator can be added to the resonator of FIG. 24 which is rotated through 90° with respect to the first, to eliminate coupling between the two resonators. The two fields $B_1$ and $B_2$ which are produced by the first and second resonator in the center of the measuring volume are also perpendicular to each other. This arrangement is shown in FIG. 25. It is particularly suitable for the study of two different types of nuclei (e.g. 1H and 13C or 1H and 19F) having different NMR frequencies which are to be examined with the highest possible sensitivity, with both types of nuclei having the same priority with regard to high sensitivity.

The second resonator which is mounted outside of the first resonator must not necessarily consist of a superconducting material but can be normally conducting. It is also possible to mount several resonators outside of the first resonator.

Arrangements with several resonators can also be used for producing spatially rotating fields. The two resonators of FIG. 25 can e.g. be tuned to the same frequency and be operated in quadrature, i.e. the second resonator is excited with transmitter pulses having a high frequency phase shifted by 90° with respect to the transmitter pulses of the first resonator. It can be shown that a spatially rotating field is produced which is much more effective for exciting the spin system than the normal spatially stationary field. The quadrature method also leads to a factor of square root 2 increase in the S/N ratio compared to the conventional method with only one resonator since the noise of the two resonators does not correlate. The maximum B1 excitation field also increases by a factor of square root 2. This method is particularly suitable for large S/N ratio measurements of samples having high losses, e.g. salt solutions.

The efficiency for rotating field generation can be increased compared to the double resonator of FIG. 25 when n structural elements are used which are constructed according to FIG. 2 and which are disposed symmetrically about the measuring volume. The plate 1d of the structural element used is disposed such that the conductor 2d is perpendicularly above the center of the measuring volume. Starting with a first structural element, n-1 further identical structural elements are added, which are rotated about the longitudinal axis of the measuring volume with respect to the first by 360°/n, 2·360°/n, 3·360°/n, . . . (n-1)·360°/n. This produces a rosette-like symmetrical structure for exciting a rotating field. Excitation of the rotating field can be achieved e.g. with two inductive loops (FIG. 21) which are spatially rotated with respect to each other by 90° and which are excited by RF pulses which are likewise phase-shifted relative to each other by 90°. The two inductive loops thereby produce a rotating field which facilitates excitation of the rotating field of the rosette-like resonator.

The value of n should not be too high due to the spatial requirements. A value of n=8 to 10 would be the upper limit in high-resolution NMR. A selection of n=8, doubles the amount of conductors contributing to generation of the rotating field compared to the arrangement of FIG. 25 (n=4), thereby nearly doubling the maximum achievable rotating field to further increase the sensitivity.

| List of Reference numerals | |
|---|---|
| 1a, 1b, 1c, 1d | monocrystalline substrates in the form of flat plates which belong to the preferred inventive resonator (FIG. 3a, 3b, 6). They receive the epitaxial conducting layers of HTS material |
| 2a, 2b, 2c, 2d | HTS conductors which belong to the inventive resonant circuit according to FIG. 10, 11 or 12. These conductors are arranged parallel to the measuring sample and mainly serve for producing the $B_1$ field |
| 3a, 3b, 3c, 3d | HTS conductors which belong to the inventive resonant circuit according to FIG. 10, 11 or 12. These conductors are arranged parallel to the measuring sample and serve for generating the resonance capacitance |
| 4 | Opening angle β of the two plates, arranged in a V-shape, of the preferred resonator of FIG. 3a, 3b, 6 |
| 5 | Measuring sample |
| 6 | Limiting cylinder which gives the separation between the cold volume of the resonator and the warm volume of the measuring sample |
| 7a, 7b | low ohmic connecting conductor between the plate 1a and 1b |
| 8a, 8b | low ohmic connecting conductor between the plate 1c and 1d |
| 9a, 9b | monocrystalline substrates in the form of flat plates which belong to the Helmholtz resonator according to prior art (FIG. 7, 8). They accommodate the epitaxial conducting layers of HTS material |
| 10a, 10b | superconducting conductors on the plate 9a and 9b which belong to the resonant circuit of FIG. 9 and which are arranged parallel to the measuring sample |
| 11a, 11b | superconducting conductor on the plate 9a and 9b for use in the resonant circuit of FIG. 9 and arranged parallel to the measuring sample |
| 12 | Coupling loop for the inductive frequency tuning of the resonator |
| 13a, 13b | capacitor plates for capacitive frequency tuning of the resonator |
| 14a, 14b | trimmer for the exact frequency tuning of the resonator |
| 15 | coupling loop for the inductive input coupling and output coupling of the transmitter pulses and of the NMR signal |
| 16a, 16b | capacitor plates for the capacitive input coupling and output coupling of the transmitter pulses and of the NMR signal |
| 17a, 17b | trimmer for impedance adjustment between the coaxial cable and resonator when the latter is inductively coupled |
| 17c, 17d, 17e | trimmer for the impedance adjustment between coaxial cable and resonator when the latter is capacitively coupled |
| 18 | connecting plug for the coaxial cable which feeds the transmitter pulses or extracts the NMR signal |
| 19a, 19b | monocrystalline substrates in the form of flat plates which belong to the resonator of FIG. 23 |
| 20b, 20d | monocrystalline substrates in the form of flat plates which belong to the resonator of FIG. 24 or to the first of the two resonators of FIG. 25 |
| 20a, 20c | monocrystalline substrates in the form of flat plates which belong to the second of the two resonators of FIG. 25. Both resonators are arranged orthogonally with respect to each other |

I claim:

1. An RF(=radio frequency) receiver coil arrangement which receives measurement signals from a measuring sample disposed in a measuring volume of an NMR (nuclear magnetic resonance) spectrometer, the receiver coil comprising:

at least one planer substrate element disposed proximate the measuring sample;

superconducting, inductively, and capacitively acting conducting structures disposed on said at least one planar substrate element; and means for connecting and arranging said conducting structures to form at least one individual current-carrying resonant circuit, wherein the conducting structures of each individual current-carrying resonant circuit are arranged and connected to each other and wherein each planar substrate element is disposed to generate a magnetic field in a center of the measuring volume which is substantially parallel to a plane of the particular planar substrate element on which said at least one respective resonant circuit is located, wherein a deviation from parallelism of said substantially parallel magnetic field does not exceed 40 degrees.

2. The RF receiver coil arrangement of claim 1, wherein the measuring volume has a longer extension in one spatial dimension than in two other spatial dimensions, with at least one of said conductor structures being disposed on said planar substrate element parallel to a longitudinal axis of the measuring volume.

3. The RF receiver coil arrangement of claim 1, wherein each superconducting resonant circuit on said planar substrate element is tuned to approximately a same resonance frequency.

4. The RF receiver coil arrangement of claim 1, wherein said resonant circuit on said planar substrate element is exclusively formed of both inductively and capacitively acting conducting structures.

5. The RF receiver coil arrangement of claim 4, wherein at least part of said superconducting conducting structures on said planar substrate element is disposed at a smallest possible separation from the measuring sample.

6. The RF receiver coil arrangement of claim 1, wherein said resonant circuit on said planar substrate element is formed by substantially purely inductively acting conducting structures and inductively and capacitively acting conducting structures.

7. The RF receiver coil arrangement of claim 6, wherein at least part of said purely inductively acting conducting structures is disposed at a smallest possible separation from the measuring sample.

8. The RF receiver coil arrangement of claim 6, wherein both inductively and capacitively acting conducting structures are disposed on regions of said planar substrate element facing away from the measuring volume.

9. The RF receiver coil arrangement of claim 6, wherein superconducting conducting paths in parts of said resonant circuit facing away from the measuring volume are branched into two or more conducting paths.

10. The RF receiver coil arrangement of claim 9, wherein said inductively and capacitively acting conducting structures of said resonant circuit comprise groups of branched conducting paths which engage each other like fingers.

11. The RF receiver coil arrangement of claim 9, wherein said inductively and capacitively acting conducting structures of said resonant circuit comprise branched conducting paths engaging each other individually like fingers.

12. The RF receiver coil arrangement of claim 9, wherein one part of said branched conducting paths in said inductively and capacitively acting conducting structures of said resonant circuit engage each other in groups and like fingers and a remaining part engages each other individually and like fingers.

13. The RF receiver coil arrangement of claim 1, wherein said superconducting conducting structures are disposed on a side of said planar substrate element facing the measuring volume.

14. The RF receiver coil arrangement of claim 1, wherein one single planar substrate element is disposed to extend tangentially outwards from the measuring volume, and said resonant circuit is provided on said substrate element having said conducting structures extending at least partially parallel to an axis of the measuring sample and being disposed as close as possible thereto.

15. The RF receiver coil arrangement of claim 14, further comprising a second identical planar substrate element which is rotated, with respect to said one single planar substrate element, through 180 degrees about a longitudinal axis of the measuring volume.

16. The RF receiver coil arrangement of claim 14, further comprising three further identical planar substrate elements which are rotated, with respect to said one single planar substrate element, through 90, 180 and 270 degrees about a longitudinal axis of the measuring volume.

17. The RF receiver coil arrangement of claim 14, further comprising n-1 further identical planar substrate elements which are rotated, with respect to said one single planar substrate element, through $360/n$, $2 \cdot 360/n$, $3 \cdot 360/n$, ...., $(n-1) \cdot 360/n$ degrees about a longitudinal axis of the measuring volume, thereby producing a symmetrical rosette-like structure, wherein n is a positive integer.

18. The RF receiver coil arrangement of claim 1, wherein two parallel planar substrate elements are disposed on opposing sides of the measuring volume, symmetrically to the measuring volume, and two superconducting resonant circuits are provided on each of said two substrate elements which are disposed symmetrically to the measuring volume, whose said conducting structures are at least partially parallel to an axis of the measuring sample and are disposed as closely as possible thereto.

19. The RF receiver coil arrangement of claim 1, wherein two pairs of planar substrate elements, disposed in a V-shape, are positioned with an open side of said V-shape close to the measuring volume and diametrally and symmetrically thereto, wherein one of said superconducting resonant circuit is provided on each individual substrate element whose said conducting structures are at least partly parallel to an axis of the measuring sample and as close as possible thereto.

20. The RF receiver coil arrangement of claim 18, further comprising a Helmholtz coil arrangement disposed externally about said planar substrate element to produce a B2 field in a center of the measuring volume which is perpendicular to a B1 field of said resonant circuits.

21. The RF receiver coil arrangement of claim 1, wherein said planar substrate element has line-shaped conducting paths.

22. The RF receiver coil arrangement of claim 1, wherein at least a part of said conducting structures which belong to said superconducting resonant circuit of a corresponding said substrate element and which are not disposed directly proximate the measuring volume has widening, conducting paths.

23. The RF receiver coil arrangement of claim 1, further comprising means for coupling to at least one further superconducting or normally conducting RF coil.

24. The RF receiver coil arrangement of claim 23, wherein at least one of said further coils comprises the RF receiver coil arrangement.

* * * * *